(12) United States Patent
Inoue et al.

(10) Patent No.: US 11,860,033 B2
(45) Date of Patent: Jan. 2, 2024

(54) PHOTODETECTOR, PHOTODETECTOR ARRAY, AND DRIVE METHOD COMPRISING A SECOND TRANSISTOR INCLUDING A CHANNEL OF FIRST CONDUCTIVITY TYPE AND A FIRST TRANSISTOR INCLUDING A CHANNEL OF SECOND CONDUCTIVITY TYPE THAT HAS POLARITY OPPOSITE TO POLARITY OF THE FIRST CONDUCTIVITY TYPE

(71) Applicant: Panasonic Intellectual Property Management Co., Ltd., Osaka (JP)

(72) Inventors: Akito Inoue, Osaka (JP); Mitsuyoshi Mori, Kyoto (JP); Yusuke Sakata, Osaka (JP); Motonori Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/111,131

(22) Filed: Feb. 17, 2023

(65) Prior Publication Data
US 2023/0204415 A1 Jun. 29, 2023

Related U.S. Application Data

(63) Continuation of application No. PCT/JP2021/030324, filed on Aug. 19, 2021.

(30) Foreign Application Priority Data

Sep. 29, 2020 (JP) ................................. 2020-164097

(51) Int. Cl.
*H01L 31/107* (2006.01)
*G01J 1/44* (2006.01)
*H03K 17/687* (2006.01)

(52) U.S. Cl.
CPC ............ *G01J 1/44* (2013.01); *H03K 17/6872* (2013.01); *G01J 2001/4466* (2013.01)

(58) Field of Classification Search
CPC ..... H01L 31/107; H01L 31/11; H01L 27/146; H01L 31/02; G01J 1/02; G01J 1/42
(Continued)

(56) References Cited

U.S. PATENT DOCUMENTS 7,166,828 B2 * 1/2007 Yamaguchi ....... H01L 27/14609
257/E31.037
2008/0290259 A1 11/2008 Mathewson et al.
(Continued)

FOREIGN PATENT DOCUMENTS

JP 2020-141012 A 9/2020
WO 2006/126026 A1 11/2006
(Continued)

OTHER PUBLICATIONS

International Search Report dated Nov. 16, 2021 in International Patent Application No. PCT/JP2021/030324, with English translation.
(Continued)

*Primary Examiner* — Que Tan Le
(74) *Attorney, Agent, or Firm* — McDermott Will & Emery LLP

(57) ABSTRACT

A photodetector includes: at least one avalanche photodiode including a first semiconductor layer of a first conductivity type and a second semiconductor layer of a second conductivity type; a first transistor connected to the first semiconductor layer and including a channel of the second conductivity type that has polarity opposite to polarity of the first conductivity type; and a second transistor connected to the first semiconductor layer and including a channel of the first conductivity type.

27 Claims, 15 Drawing Sheets

(58) Field of Classification Search
USPC .......................................... 250/214 R, 214.1
See application file for complete search history.

(56) References Cited

U.S. PATENT DOCUMENTS

| | | |
|---|---|---|
| 2020/0273895 A1 | 8/2020 | Sasago et al. |
| 2021/0028202 A1 | 1/2021 | Inoue et al. |
| 2021/0176413 A1 | 6/2021 | Inoue et al. |

FOREIGN PATENT DOCUMENTS

| | | |
|---|---|---|
| WO | 2019/189700 A1 | 10/2019 |
| WO | 2020/045363 A1 | 3/2020 |

OTHER PUBLICATIONS

Matteo Perenzoni, et al., "A 160×120 Pixel Analog-Counting Single-Photon Imager With Time-Gating and Self-Referenced Column-Parallel A/D Conversion for Fluorescence Lifetime Imaging", IEEE Journal of Solid-State Circuits, vol. 51, No. 1, Jan. 2016, pp. 155-167.

\* cited by examiner

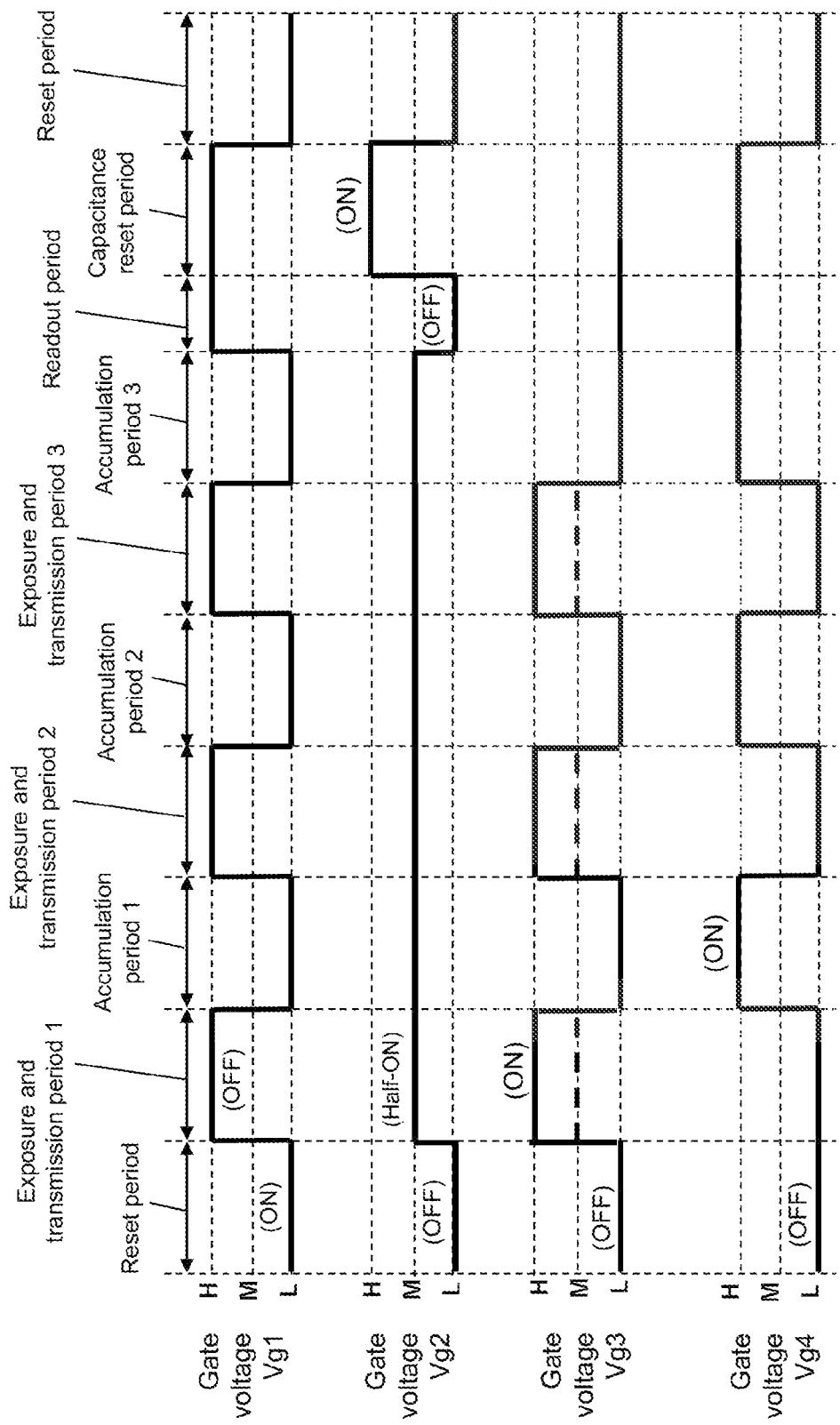

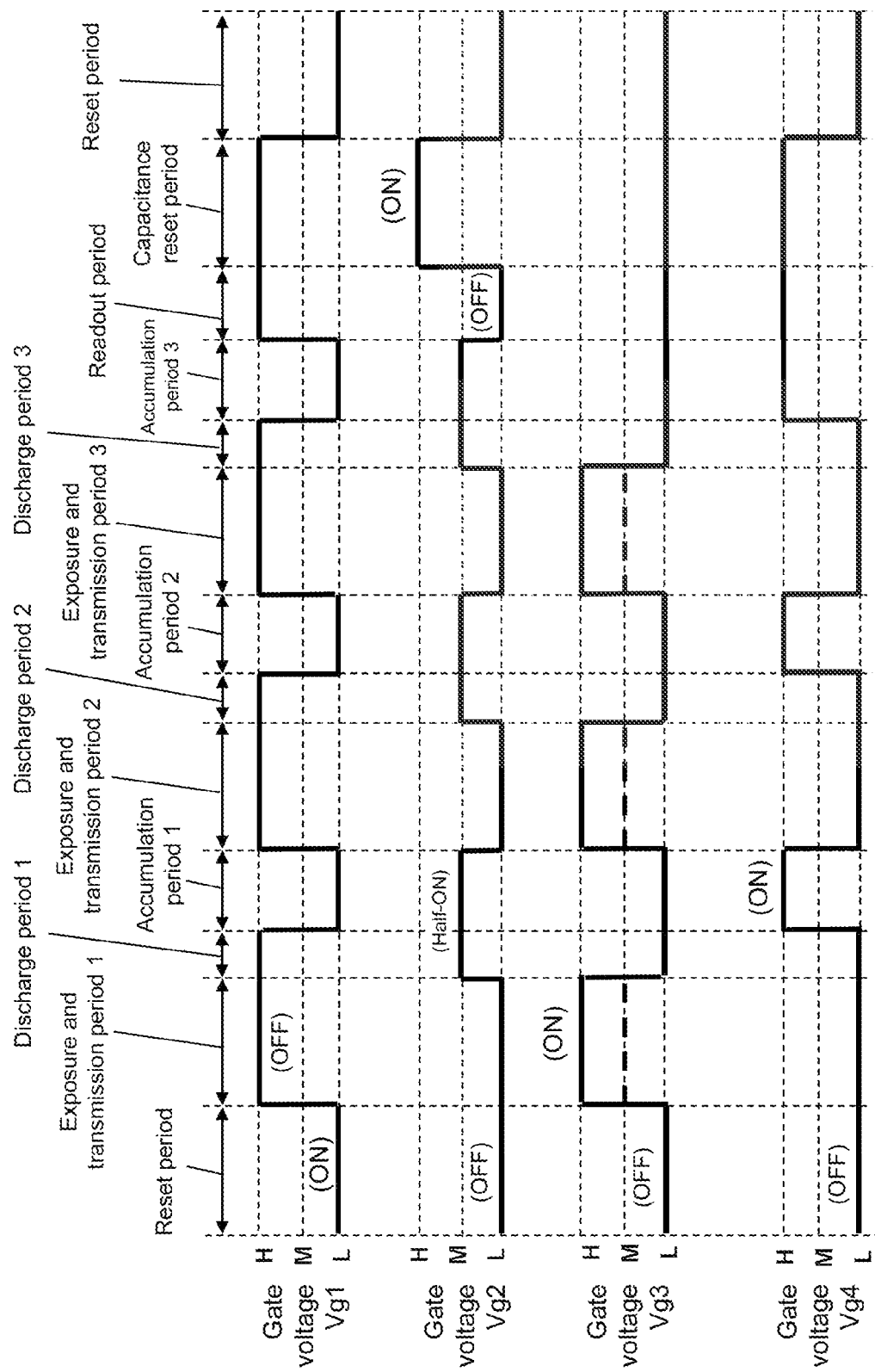

PHOTODETECTOR, PHOTODETECTOR ARRAY, AND DRIVE METHOD COMPRISING A SECOND TRANSISTOR INCLUDING A CHANNEL OF FIRST CONDUCTIVITY TYPE AND A FIRST TRANSISTOR INCLUDING A CHANNEL OF SECOND CONDUCTIVITY TYPE THAT HAS POLARITY OPPOSITE TO POLARITY OF THE FIRST CONDUCTIVITY TYPE

CROSS REFERENCE TO RELATED APPLICATIONS

This is a continuation application of PCT International Application No. PCT/JP2021/030324 filed on Aug. 19, 2021, designating the United States of America, which is based on and claims priority of Japanese Patent Application No. 2020-164097 filed on Sep. 29, 2020. The entire disclosures of the above-identified applications, including the specifications, drawings and claims are incorporated herein by reference in their entirety.

FIELD

The present disclosure relates to a photodetector that detects a photon, a photodetector array, and a drive method.

BACKGROUND

Patent Literature (PTL) 1 discloses, in FIG. 1, a method for reading voltage changes in an avalanche photodiode (APD) in which charge is accumulated by bringing, using a switch, the APD and a power source into conduction during a reset period and into insulation during an exposure period.

CITATION LIST

Patent Literature

PTL 1: International Publication No. 2006/126026

SUMMARY

Technical Problem

The present disclosure provides a photodetector, a photodetector array, and a drive method which have improved reliability.

Solution to Problem

A photodetector according to one aspect of the present disclosure includes: at least one avalanche photodiode including a first semiconductor layer of a first conductivity type and a second semiconductor layer of a second conductivity type; a first transistor connected to the first semiconductor layer and including a channel of the second conductivity type that has polarity opposite to polarity of the first conductivity type; and a second transistor connected to the first semiconductor layer and including a channel of the first conductivity type.

In addition, a photodetector array according to one aspect of the present disclosure includes two or more of the above-described photodetectors.

Moreover, a drive method for driving a photodetector according to one aspect of the present disclosure is a drive method for a photodetector that includes: at least one avalanche photodiode including a first semiconductor layer of a first conductivity type and a second semiconductor layer of a second conductivity type; a first transistor connected to the first semiconductor layer and including a channel of the second conductivity type that has polarity opposite to polarity of the first conductivity type; and a second transistor connected to the first semiconductor layer and including a channel of the first conductivity type. The drive method includes: during a reset period, bringing (i) the first transistor into conduction to reset a voltage of the first semiconductor layer to a first voltage and (ii) the second transistor into non-conduction; and during an exposure period after the reset period, bringing (i) the first transistor into non-conduction and (ii) the second transistor into a half-ON state.

Note that these comprehensive or specific aspects may be realized by a system, a method, an integrated circuit, a computer program, or a recording medium such as a computer-readable CD-ROM, or by an optional combination of the system, the method, the integrated circuit, the computer program, and the recording medium.

Advantageous Effects

The present disclosure can improve the reliability of a photodetector.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 7A is a timing diagram illustrating an example of a drive method for driving the photodetector according to Variation 2 of Embodiment 1.

FIG. 7B is a timing diagram illustrating an example of another drive method for driving the photodetector according to Variation 2 of Embodiment 1.

Figure 1:
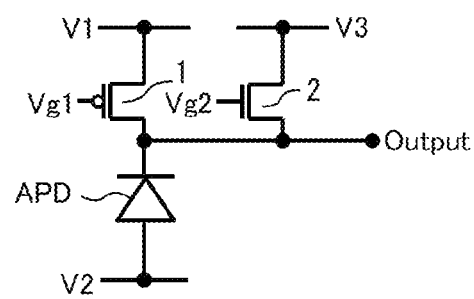
FIG. 1 is a circuit diagram illustrating an example of a configuration of a photodetector according to Embodiment 1.

DESCRIPTION OF EMBODIMENTS (Underlying Knowledge Forming Basis of the Present Disclosure)

The present inventors have found that the prior art presented in the "Background Art" section poses the following problems. According to PTL 1, voltage changes in an APD is constant during an optional exposure period, and thus a sufficiently long readout time can be set. Moreover, since the circuit configuration can be simplified, the apparatus disclosed in PTL 1 has an advantage in fining of an APD. However, an extension of a reset period increases an amount of current flowing through the APD. Meanwhile, shortening of the reset period prevents charge generated due to dark current or photo current from being discharged from the APD. Particularly for a fine APD array in which a switch is a transistor, charge accumulated in each of APDs may cause a withstand-voltage breakdown of a gate oxide film, and this results in a reduction in reliability of a circuit.

In view of the above, the present disclosure provides a photodetector, a photodetector array, and a drive method which have improved reliability.

In order to address the above-described problems, a photodetector according to one aspect of the present disclosure includes: at least one avalanche photodiode including a first semiconductor layer of a first conductivity type and a second semiconductor layer of a second conductivity type; a first transistor connected to the first semiconductor layer and including a channel of the second conductivity type that has polarity opposite to polarity of the first conductivity type; and a second transistor connected to the first semiconductor layer and including a channel of the first conductivity type.

In addition, a photodetector array according to one aspect of the present disclosure includes two or more of the above-described photodetectors.

Moreover, a drive method for driving a photodetector according to one aspect of the present disclosure is a drive method for a photodetector that includes: at least one avalanche photodiode including a first semiconductor layer of a first conductivity type and a second semiconductor layer of a second conductivity type; a first transistor connected to the first semiconductor layer and including a channel of the second conductivity type that has polarity opposite to polarity of the first conductivity type; and a second transistor connected to the first semiconductor layer and including a channel of the first conductivity type. The drive method includes: during a reset period, bringing (i) the first transistor into conduction to reset a voltage of the first semiconductor layer to a first voltage and (ii) the second transistor into non-conduction; and during an exposure period after the reset period, bringing (i) the first transistor into non-conduction and (ii) the second transistor into a half-ON state.

With this, excessive charge generated in an avalanche photodiode during an exposure period can be discharged via the second transistor. Accordingly, dielectric breakdowns of gate oxide films of the first transistor and the second transistor are less likely to occur, and thus the reliability of the photodetector can be improved.

Hereinafter, embodiments will be described in detail with reference to the drawings.

Note that the embodiments below each describe a general or specific example. The numerical values, shapes, materials, structural elements, the arrangement and connection of the structural elements, steps, and orders of the steps, etc. presented in the embodiments below are mere examples, and thus are not intended to limit the present disclosure.

Embodiment 1

A photodetector according to Embodiment 1 and a drive method for driving the photodetector will be described with reference to FIG. 1 through FIG. 3B.

FIG. 1 is a circuit diagram illustrating an example of a configuration of the photodetector according to Embodiment 1. The photodetector illustrated in FIG. 1 includes an avalanche photodiode (hereinafter, may be abbreviated as APD), first transistor 1 including a channel of a second conductivity type, and second transistor 2 including a channel of a first conductivity type.

The APD is a photoelectric conversion element including a first semiconductor layer of the first conductivity type and a second semiconductor layer of the second conductivity type. The APD has (i) a Geiger multiplication mode in which charge abruptly multiplies due to an avalanche effect when a photon is detected and (ii) a linear multiplication mode in which charge according to an amount of incident light is generated. Note that the first conductivity type and the second conductivity type are opposite in polarity. Specifically, the first conductivity type is one of an N type and a P type, and the second conductivity type is the other of the N type and the P type. FIG. 1 shows an example in which the first conductivity type is the N type and the second conductivity type is the P type.

Both first transistor 1 and second transistor 2 are connected to a first conductivity type-end of the avalanche photodiode, namely first semiconductor layer 11. In other words, the drain of first transistor 1 is connected to the cathode that is the first semiconductor layer of the APD. The source of second transistor 2 is also connected to the cathode that is the first semiconductor layer of the APD.

Moreover, one end of first transistor 1 is connected to a power line of first voltage V1. In FIG. 1, the source of first transistor 1 is connected to the power line of first voltage V1.

The anode of the APD, namely the second semiconductor layer, is connected to the power line of second voltage V2.

One end of second transistor 2 is connected to the power line of third voltage V3. In FIG. 1, the drain of second transistor 2 is connected to the power line of third voltage V3.

Although, in FIG. 1, the first conductivity type and the second conductivity type are specified as the N type and the P type, respectively, conductivity types are not limited to the above as long as the relationship can be maintained. In addition, a voltage of each of first voltage V1 and second voltage V2 is set such that reverse bias is applied to the APD. A difference between the voltages may be greater than or equal to a breakdown voltage. Moreover, a voltage of each of second voltage V2 and third voltage V3 is set such that reverse bias is applied to the APD. A difference between the voltages may be greater than or equal to the breakdown voltage. First voltage V1 and third voltage V3 may have the same voltage. In this case, an end of first transistor 1 and an end of second transistor 2 which are not connected to the APD may be connected to each other.

Figure 2:
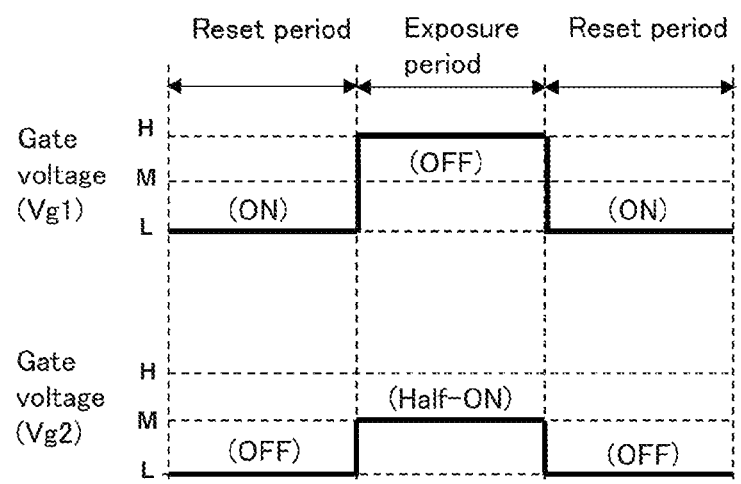
FIG. 2 is a timing diagram illustrating an example of a drive method for driving the photodetector according to Embodiment 1.

FIG. 2 is a timing diagram illustrating an example of a drive method for driving the photodetector illustrated in FIG. 1. The vertical axis in FIG. 2 represents gate voltage Vg1 applied to the gate of first transistor 1 and gate voltage Vg2 applied to the gate of second transistor 2. The letters H, L, and M indicated beside the vertical axis are abbreviations of a high level, a low level, and a middle level, respectively. In other words, the letter H denotes a high voltage, L denotes a low voltage, and M denotes an intermediate voltage that is a voltage value between H and L. The horizontal axis in FIG. 2 represents time. Since first transistor 1 is a P-type channel MOS transistor in FIG. 1, first transistor 1 is in the ON state when gate voltage Vg1 is at L, and is in the OFF state when gate voltage Vg1 is at H. Moreover, since second transistor 2 is an N-type channel MOS transistor in FIG. 1, second transistor 2 is in the OFF state when gate voltage Vg2 is at L, is in the ON state when gate voltage Vg2 is at H, and is in the half-ON state when gate voltage Vg2 is at M. Here, the term half-ON state means a state in which the on-resistance is greater than the on-resistance of the fully-ON state.

The timing diagram in FIG. 2 is based on the circuit diagram illustrated in FIG. 1, and indicates voltage values in the case in which first transistor 1 and second transistor 2 are of the P type and the N type, respectively. However, the conductivity type of first transistor 1 and the conductivity type of second transistor 2 are not limited to the above-described conductivity types. If the conductivity types are other way around, H and L of the gate voltage are to be set other way around. As illustrated in FIG. 2, gate voltage Vg1 of first transistor 1 is set at L to bring first transistor 1 into conduction during a reset period. With this, a cathode voltage of the APD is reset to first voltage V1. Meanwhile, gate voltage Vg2 of second transistor 2 is set at L to bring second transistor 2 into non-conduction during the reset period. With this, the APD is insulated from the power line of third voltage V3.

During an exposure period, gate voltage Vg1 of first transistor 1 is set at H to bring first transistor 1 into non-conduction. With this, the APD is insulated from the power line of first voltage V1. By reading out an output at any point in time during the exposure period, light that has been incident on the APD can be detected. Meanwhile, gate voltage Vg2 of second transistor 2 is set at M during the exposure period. Accordingly, second transistor 2 is brought into the half-ON state. The half-ON state is an incomplete ON state and is also an incomplete OFF state. The half-ON state is a state having a resistance value determined according to a voltage set for M and a cathode voltage of the APD. When charge is excessively generated in the APD during the exposure period, a cathode voltage of the APD is reduced, and a resistance value between the source and the drain of second transistor 2 is reduced. Accordingly, the excessive charge is discharged into the power line of third voltage V3. When an amount of charge generated in the APD is small, a resistance value between the source and the drain of second transistor 2 is large. Accordingly, electrons accumulated in the cathode of the APD are not discharged into the power line of third voltage V3. Excessive charge may cause gate breakdowns of first transistor 1 and second transistor 2 which are connected to the APD; however, the present disclosure can realize an APD with high reliability which can discharge excessive charge and can prevent gate breakdowns. Here, during the exposure period, gate voltage Vg2 of second transistor 2 may be set such that the APD and third voltage V3 are insulated from each other. Gate voltage Vg2 may also be set at M.

The above-described configuration is particularly effective when a plurality of APDs are arrayed. When a plurality of APDs are arrayed, excessive charge is generated in only some of the APDs since there is a case where an amount of incident light differs for each of the ADPs and a case where dark current is large due to crystal defects. If second transistor 2 is not provided, it is necessary to set (i) a short exposure period in agreement with an APD that has the largest amount of generated charge or (ii) different exposure periods for the plurality of APDs. However, providing of second transistor 2 can set a sufficiently long exposure period while all of the APDs have the same exposure period. Here, although FIG. 2 only shows an exposure period and reset periods, other periods may be provided.

Next, operation principles of the photodetector illustrated in FIG. 1 will be described with reference to potential diagrams.

Figure 3A:
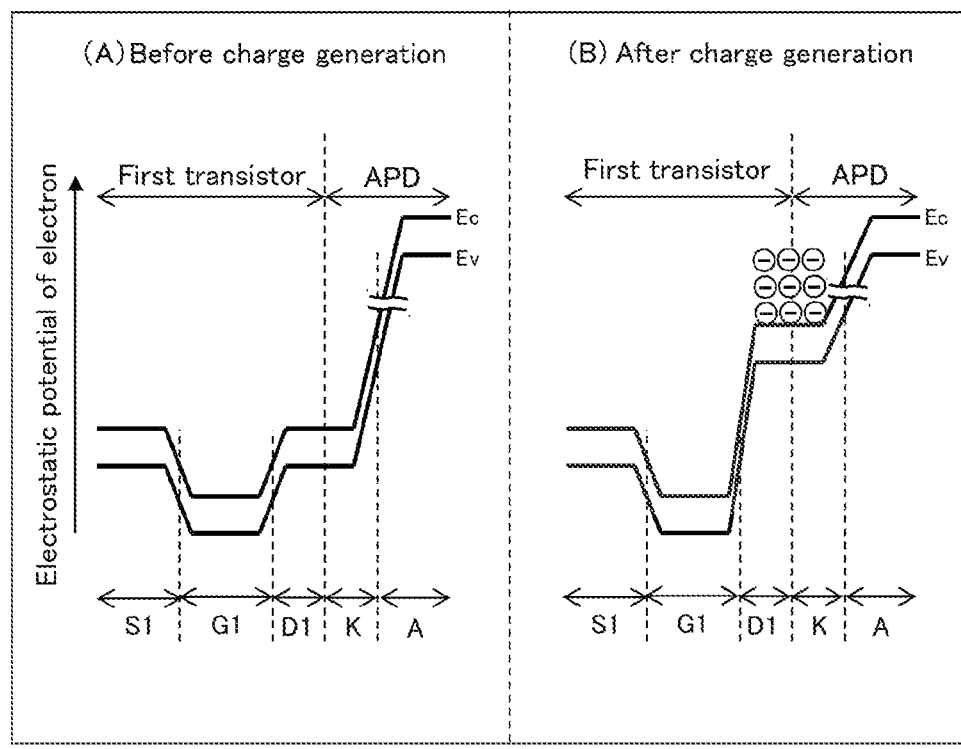
FIG. 3A illustrates potential diagrams showing operation principles of a photodetector according to a comparative example.

FIG. 3A illustrates potential diagrams showing operation principles of a photodetector according to a comparative example. The comparative example here shows the circuit illustrated in FIG. 1 from which second transistor 2 is excluded. FIG. 3A schematically illustrates diagrams showing potential during an exposure period. The vertical axis represents electrostatic potential of an electron. The upper part of the vertical axis is a direction toward which energy of an electron increases, and corresponds to a direction in which a voltage is low. The term Ec denotes the energy level of a lower end of the conduction band, and the term Ev denotes the energy level of an upper end of the valence band. The channel of first transistor 1 and the end of an APD to which the channel is connected are opposite in polarity. In FIG. 3A, the channel of first transistor 1 is of the P type.

As shown in "(A) Before charge generation" in FIG. 3A, reverse bias is applied to an APD before charge is generated in the APD, and thus the anode has low potential and the cathode has high potential. The drain of first transistor 1 is connected with the cathode of the APD. The gate potential is set higher than the drain potential and the source potential, and the source and the drain are insulated from each other.

As shown in "(B) After charge generation" in FIG. 3A, electrons accumulate in junction capacitance of the cathode of the APD and parasitic capacitance connected to the cathode when charge is generated in the APD. With this, the cathode voltage of the APD and the drain voltage of first transistor 1 are reduced, and the potential difference between the gate and the drain of first transistor 1 increases accordingly. For this reason, a withstand-voltage breakdown may occur when an exposure period lasts relatively long.

Figure 3B:
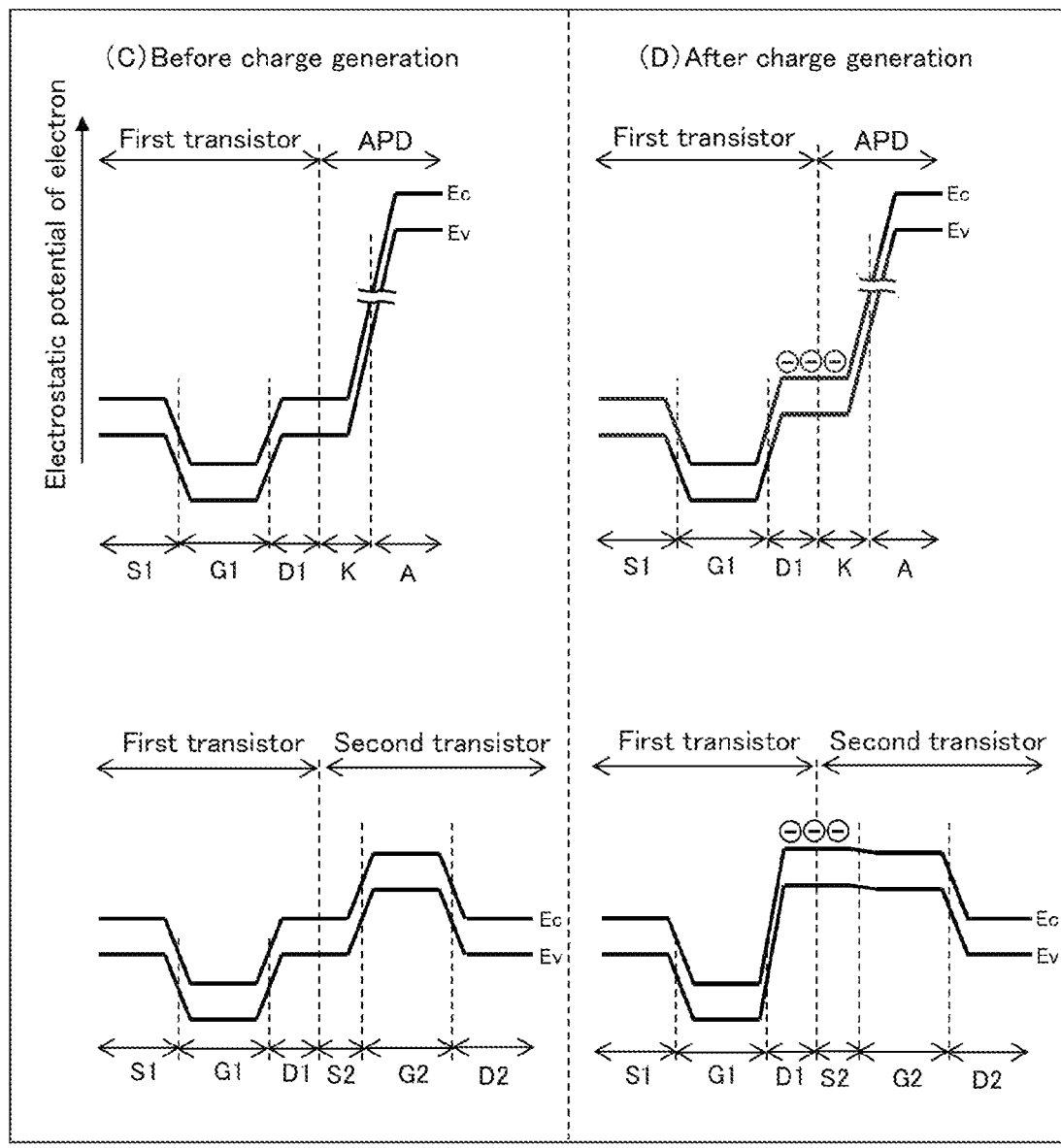
FIG. 3B illustrates potential diagrams showing operation principles of the photodetector according to Embodiment 1.

FIG. 3B illustrates potential diagrams showing operation principles of the photodetector illustrated in FIG. 1. FIG. 3B schematically illustrates potential diagrams in the case in which the photodetector includes second transistor 2. The upper sections of the potential diagrams correspond to a node connecting first transistor 1 and the APD, and the lower sections of the potential diagrams correspond to a node connecting first transistor 1 and second transistor 2.

As shown in "(C) Before charge generation" in FIG. 3B, the states of the APD and first transistor 1 are the same as the states of the APD and first transistor 1 in FIG. 3A. In FIG. 1, the source of second transistor 2 is connected with the drain of first transistor 1 and the cathode of the APD. In second transistor 2, the gate potential is set lower than the drain potential and the source potential, and the source and the drain are insulated from each other.

As shown in "(D) After charge generation" in FIG. 3B, the cathode voltage changes and the source potential of second transistor 2 changes when charge is generated in the APD. With this, a voltage difference between the gate and the source of second transistor 2 decreases, and the amount of current flowing through second transistor 2 is increased accordingly. For this reason, even if excessive charge is generated in the APD, the excessive charge can be discharged via second transistor 2, and thus the voltage between the drain and the gate of first transistor 1 can be kept low. Accordingly, an occurrence of a withstand-voltage breakdown of first transistor 1 can be prevented.

If gate voltage Vg2 of second transistor 2 is too high when an APD is used in the Geiger multiplication mode, the Geiger multiplication cannot be quenched. Accordingly, excessive current flows between second voltage V2 and third voltage V3, causing, for example, heat generation. In order to prevent this, a difference between gate voltage Vg2 of second transistor 2 and the anode voltage of the APD may be set lower than or equal to the breakdown voltage of the APD. Here, the breakdown voltage is a voltage at which the Geiger multiplication mode and the linear multiplication mode of the APD switch. Since a typical transistor has a difference between gate voltage Vg and the source voltage which is dependent on the concentration of an impurity, a problem in practical use may not occur due to this voltage difference even if a difference between gate voltage Vg2 of second transistor 2 and the anode voltage of the APD is not set lower than or equal to the breakdown voltage of the APD. However, the present disclosure also includes the foregoing case. Whether the above-mentioned condition is satisfied or not can be determined by the magnitude of current flowing through the APD and second transistor 2 during an exposure period. For example, it is determined by a change in gate voltage Vg2 of second transistor 2 and the resultant increase in an amount of current during the exposure period.

Since resistance of first transistor 1 is sufficiently high during a reset period when the APD is used in the Geiger multiplication mode, quenching may be performed. The on-resistance of a transistor typically ranges from about 10 kohm to 10 Mohm. Particularly, the conductivity type of the channel of first transistor 1 and the conductivity type of the first semiconductor layer may be opposite. With this, even if a voltage of the first semiconductor layer changes due to charge generated by avalanche multiplication, channel resistance of the first transistor does not greatly change. Accordingly, quenching is readily performed.

Note that a conduction state of first transistor 1 during a reset period shown in FIG. 2 includes, not only a conduction state in which first transistor 1 is in a complete ON state, but also a conduction state in which first transistor 1 is in an incomplete ON state for fulfilling a quenching function. Specifically, gate voltage Vg1 of first transistor 1 during the reset period shown in FIG. 2 may be set at a level slightly higher than the L level, namely a level closer to the M level.

Accordingly, first transistor 1 during the reset period is not in the complete ON state but in the incomplete ON state, and thus can have a certain resistance value. With this, first transistor 1 can have the quenching function (a function that reduces excessive charge due to an avalanche).

As has been described above, the photodetector according to Embodiment 1 includes: at least one APD including a first semiconductor layer of the first conductivity type and a second semiconductor layer of the second conductivity type; first transistor 1 connected to the first semiconductor layer and including a channel of the second conductivity type that has polarity opposite to polarity of the first conductivity type; and second transistor 2 connected to the first semiconductor layer and including a channel of the first conductivity type.

With this, the reliability of the photodetector can be improved. For example, even if excessive charge is generated in an avalanche photodiode, charge can be discharged via second transistor 2. Accordingly, resistance to a dielectric breakdown of the gate oxide film can be improved.

Here, first transistor 1 may be brought into (i) conduction during a reset period to reset a voltage of the first semiconductor layer to first voltage V1, and (ii) non-conduction during an exposure period during which an APD detects light.

According to the above, first transistor 1 includes a channel of the second conductivity type having polarity opposite to the polarity of the first semiconductor layer of the APD, and is in the non-conduction state during the exposure period. Accordingly, the length of an exposure period can be optionally set, from a short period to a long period.

Here, second transistor 2 may be brought into (i) non-conduction during the reset period, and (ii) a half-ON state during the exposure period.

According to the above, excessive charge generated in an avalanche photodiode can be discharged via second transistor 2. Accordingly, dielectric breakdowns of gate oxide films of first transistor 1 and second transistor 2 are less likely to occur, and thus the reliability of the photodetector can be improved.

Here, during the exposure period, a difference between a gate voltage of second transistor 2 and second voltage V2 that is a voltage of second semiconductor layer 12 included in the APD may be less than a breakdown voltage of the APD.

With this, second transistor 2 is less likely to adversely affect a reverse bias voltage of an APD, namely a difference between the second voltage and the first voltage. For example, it is possible to prevent the Geiger multiplication mode and the linear multiplication mode which are operation modes of the APD from unintentionally making a mode transition due to the gate voltage of second transistor 2.

Here, first transistor 1 may include a first terminal connected to the first semiconductor layer and a second terminal connected to a power line. Second transistor 2 may include a third terminal connected to the first semiconductor layer and a fourth terminal connected to the power line. The second terminal and the fourth terminal may be electrically connected.

With this, a supply voltage of first transistor 1 and a supply voltage of second transistor 2 are commonly used. This is suitable for downsizing and an area size reduction of a circuit.

Here, the APD may be used in a Geiger multiplication mode.

In addition, a drive method for driving a photodetector is a drive method for driving a photodetector that includes: at least one avalanche photodiode (hereinafter, referred to as APD) including a first semiconductor layer of a first conductivity type and second semiconductor layer 12 of a second conductivity type; first transistor 1 connected to the first semiconductor layer and including a channel of the second conductivity type that has polarity opposite to polarity of the first conductivity type; and second transistor 2 connected to the first semiconductor layer and including a channel of the first conductivity type. The drive method includes: during a reset period, bringing (i) first transistor 1 into conduction to reset a voltage of the first semiconductor layer to first voltage V1 and (ii) second transistor 2 into non-conduction; and during an exposure period after the reset period, bringing (i) first transistor 1 into non-conduction and (ii) second transistor 2 into a half-ON state.

With this, excessive charge generated in an avalanche photodiode during an exposure period can be discharged via second transistor 2. Moreover, dielectric breakdowns of gate oxide films of first transistor 1 and second transistor 2 can be prevented.

[Variation 1 of Circuit]

Figure 4:
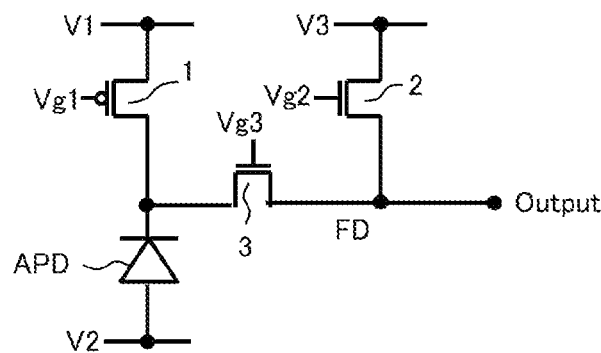
FIG. 4 is a circuit diagram illustrating an example of a configuration of a photodetector according to Variation 1 of Embodiment 1.
Figure 5:
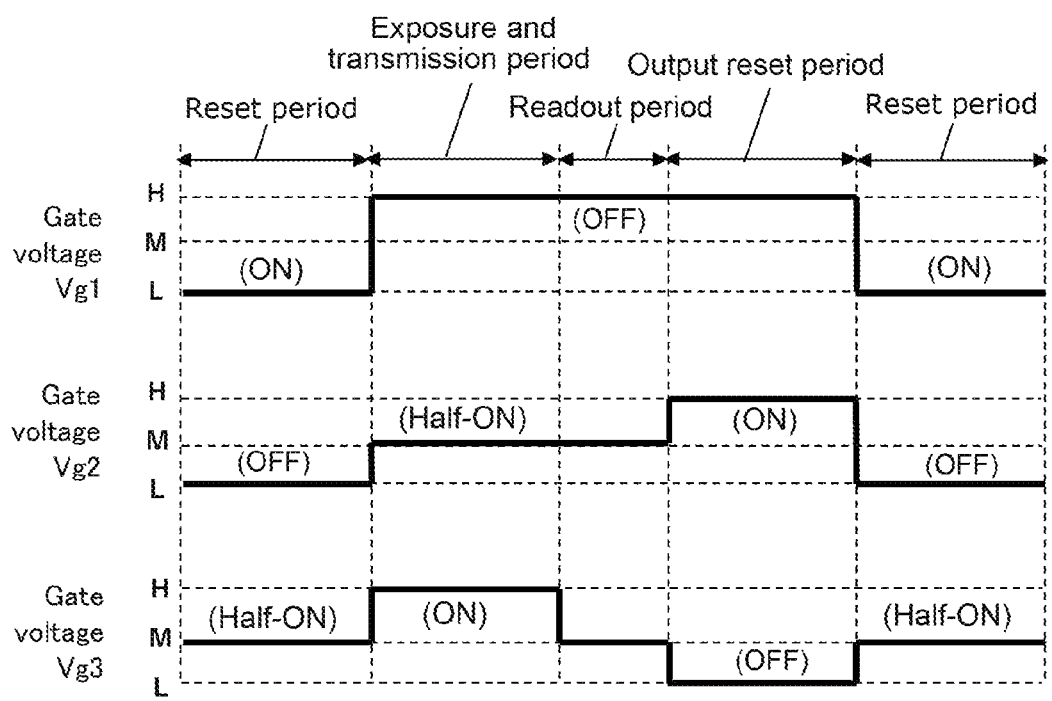
FIG. 5 is a timing diagram illustrating an example of a drive method for driving the photodetector according to Variation 1 of Embodiment 1.

A variation of the circuit according to Embodiment 1 will be described with reference to FIG. 4 and FIG. 5. FIG. 4 is a circuit diagram illustrating an example of a configuration of a photodetector according to Variation 1 of Embodiment 1. In addition to the circuit illustrated in FIG. 1, the photodetector in FIG. 4 includes third transistor 3. The cathode of an APD and second transistor 2 are connected via third transistor 3. The connection portion at which second transistor 2 and third transistor 3 are connected to each other is an output node. FIG. 5 is a timing diagram illustrating an example of a drive method for driving the photodetector according to Variation 1 of Embodiment 1. As compared to the timing diagram illustrated in FIG. 2, an exposure period is changed to an exposure and transmission period, and the following periods are added: a readout period in which an output value of the output node is read out following the exposure and transmission period, and an output reset period in which a voltage of the output node is reset. Gate voltage Vg1 of first transistor 1 is at H during the exposure and transmission period, readout period, and output reset period, and is at L during a reset period. Gate voltage Vg2 of second transistor 2 is at H during the output reset period, is at M during the exposure and transmission period and readout period, and is at L during a reset period. Gate voltage Vg3 of third transistor 3 is at H during the exposure and transmission period, is at M during the readout period and a reset period, and is at L during the output reset period. With this circuit, charge generated in the APD is transmitted to the output node during the exposure and transmission period, and the APD and the output node are insulated from each other during the readout period. Accordingly, the length of the exposure and transmission period is not affected by the length of the readout period, and can optionally be shortened.

Here, third transistor 3 may include a channel of the first conductivity type. If third transistor 3 include the channel of the first conductivity type, excessive charge generated in the APD can be discharged in the same principle as the principle of discharging excessive charge generated in the above-described APD via second transistor 2.

As has been described above, the photodetector according to Variation 1 of Embodiment 1 further includes third transistor 3 including a channel of the first conductivity type. The second transistor is connected to the first semiconductor layer via the third transistor.

With this, an exposure period and a period during which charge is output can be separated. Accordingly, the length of each of the periods can be optionally determined, and an operation speed can be flexibly determined.

Here, during a transmission period, third transistor 3 may transmit charge accumulated in the APD to one end of second transistor 2. The exposure period and the transmission period may be the same period.

With this, a processing speed can be improved since all driving can be performed as compared to the case where the driving is performed in different periods. Note that the same period means to include substantially the same period.

[Variation 2 of Circuit]

Figure 6:
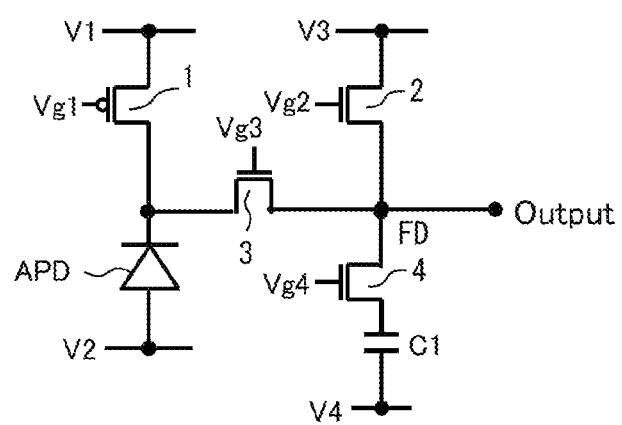
FIG. 6 is a circuit diagram illustrating an example of a configuration of a photodetector according to Variation 2 of Embodiment 1.

A different variation of the circuit according to Embodiment 1 will be described with reference to FIG. 6 and FIG. 7A. FIG. 6 is a circuit diagram illustrating an example of a configuration of a photodetector according to Variation 2 of Embodiment 1. In addition to the circuit illustrated in FIG. 4, the photodetector illustrated in FIG. 6 includes fourth transistor 4. One end of fourth transistor 4 is connected to a connection portion at which second transistor 2 and third transistor 3 are connected to each other, and the other end of fourth transistor 4 is connected to storage capacitance element C1. The other end of storage capacitance element C1 is connected to fourth voltage V4. FIG. 7A is a timing diagram illustrating an example of a drive method for driving the photodetector according to Variation 2 of Embodiment 1. The timing diagram of one cycle consists of a reset period, a plurality of exposure and transmission periods, a plurality of accumulation periods, a readout period, and a capacitance reset period. The reset period is a period during which the cathode voltage of an APD is set to first voltage V1. During the reset period, first transistor 1 is at L, second transistor 2 is at L, third transistor 3 is at L, and fourth transistor 4 is at L. The exposure and transmission periods each are a period during which light incident on the APD is detected, and generated charge is transmitted to an output node to be temporarily accumulated. During each exposure and transmission period, first transistor 1 is at H, second transistor 2 is at M, third transistor 3 is at H, and fourth transistor 4 is at L. The accumulation periods each are a period during which the charge transmitted to the output node is further transmitted to storage capacitance element C1 to be accumulated. During each accumulation period, first transistor 1 is at L, second transistor 2 is at M, third transistor 3 is at L, and fourth transistor 4 is at H. Particularly, in the timing diagram shown in FIG. 7A, first transistor 1 is at L since the cathode voltage of the APD is reset during an accumulation period. However, the cathode voltage may be reset during a different period. The exposure and transmission period may be repeated for any number of times. Particularly, second transistor 2 may be set at M during the exposure and transmission period. Setting second transistor 2 at M during the exposure and transmission period enables part of charge temporarily accumulated in the output node to be discharged to third voltage V3. Accordingly, an amount of charge transmitted to storage capacitance element C1 during one accumulation period can be controlled. Moreover, a period during which second transistor 2 is set at M may be (i) either an exposure and transmission period or an accumulation period, (ii) provided separately from the exposure and transmission period or the accumulation period, or (iii) a period before fourth transistor 4 is brought into a conduction state. The readout period is a period during which a signal produced by charge accumulated in storage capacitance element C1 is read out. During the readout period, first transistor 1 is at H, second transistor 2 is at L, third transistor 3 is at L, and fourth transistor 4 is at H. The capacitance reset period is a period during which charge accumulated in storage capacitance element C1 is discharged to set voltages of the output node and storage capacitance element C1 to third voltage V3. During the capacitance reset period, first transistor 1 is at H, second transistor 2 is at H, third transistor 3 is at L, and fourth transistor 4 is at H. With these series of operations, charge generated in the APD can be accumulated in storage capacitance element C1, and the accumulated charge can be read out. Accordingly, a dynamic range can be extended.

Here, the circuit diagram shown in FIG. 6 and the timing diagram shown in FIG. 7A are particularly effective when the APD is used in the Geiger multiplication mode.

Figure 8:
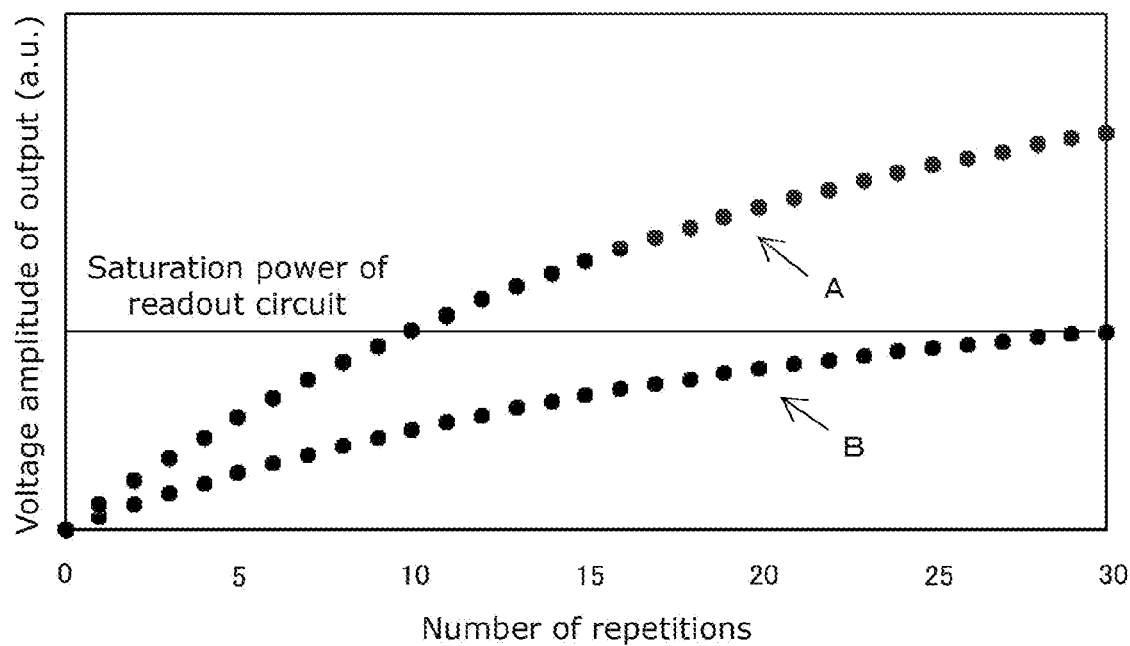
FIG. 8 is a diagram illustrating results of simulations performed on a photodetector according to Variation 3 of Embodiment 1.

FIG. 8 is a diagram illustrating results of simulations performed on a photodetector according to Variation 3 of Embodiment 1. The simulations are performed on the precondition that the APD is operated in the Geiger multiplication mode. The diagram shows a voltage amplitude of an output according to the number of times that a photon is detected in the Geiger multiplication mode within one exposure period. Dotted line B in FIG. 8 shows a result obtained by a simulation performed on the photodetector according to the circuit diagram illustrated in FIG. 6 and the timing diagram illustrated in FIG. 7A. Dotted line A shows a result obtained by a simulation performed on the photodetector in the case where excessive charge is not discharged in the drive method shown in the timing diagram illustrated in FIG. 7A, and corresponds to, for example, a result obtained by performance of a simulation in which second transistor 2 is set at L during an exposure and transmission period and an accumulation period. When the APD is used in the Geiger multiplication mode, a large amount of charge can be generated from a single photon, and a voltage amplitude of the charge is determined by an excessive voltage which is a difference between reverse bias and a breakdown voltage of the APD. The higher the excessive voltage, the greater the amplitude of a voltage. In order to increase the probability of photon detection, excessive bias may be increased. However, in this case, the number of repetitions cannot be increased since an output increases as denoted by dotted line A in FIG. 8 and exceeds saturation power of the circuit. Meanwhile, the use of the circuit configuration shown in FIG. 6 and the method shown in FIG. 7A can reduce an amount of charge to be accumulated in storage capacitance element C1 during one accumulation period by discharging, via second transistor 2, charge generated due to the Geiger multiplication. Accordingly, the number of repetitions can be increased. As has been described above, it is effective to set a voltage of second transistor 2 to an intermediate voltage between a voltage in a conduction state and a voltage in an insulation state during one of or both of (i) exposure and transmission periods and (ii) accumulation periods in the circuit including first transistor 1 of the second conductivity type, second transistor 2 of the first conductivity type, third transistor 3, fourth transistor 4, and storage capacitance element C1.

Here, FIG. 7B illustrates a variation of the timing diagram shown in FIG. 7A. In FIG. 7B, a discharge period is provided between an exposure and transmission period and an accumulation period. As compared to FIG. 7A, second transistor 2 is set at L during exposure and transmission periods, and first transistor 1 is set at H, second transistor 2 is set at M, third transistor 3 is set at L, and fourth transistor 4 is set at L during discharge periods. As has been described above, if gate voltage Vg2 is set too high when third transistor 3 is conducting, the Geiger multiplication in the APD cannot be quenched. Accordingly, excessive current flows between second voltage V2 and third voltage V3, causing, for example, heat generation. In the timing diagram shown in FIG. 7B, a voltage of second transistor 2 is decreased during the exposure and transmission periods during which third transistor 3 conducts, and a voltage of second transistor 2 is increased during the discharge periods during which third transistor 3 insulates. Accordingly, a voltage that can be applied to the anode of the APD can be increased, and thus the reliability of the photodetector can be increased. Moreover, it is desirable that first transistor 1 and second transistor 2 have withstand pressure higher than that of the other transistors. With this, a voltage that can be applied to the anode of the APD can be further increased, and thus the reliability of the photodetector can be further increased. For example, the thickness of the gate oxide film of one of or both of first transistor 1 and second transistor 2 may be greater than the other transistors.

Here, although gate voltage Vg3 of third transistor 3 during the exposure and transmission periods is set at H in the timing diagrams shown in FIG. 7A and FIG. 7B, third transistor 3 need not be brought into complete conduction. Instead, third transistor 3 may be set at M as denoted by the dashed lines, for example. In other words, during at least one of (i) the exposure and transmission periods or (ii) the discharge periods, gate voltage Vg3 of third transistor 3 is lower than gate voltage Vg2 when second transistor 2 is in conduction state. Alternatively, a threshold voltage of third transistor 3 is higher than a threshold voltage of second transistor 2. With this, backflow of charge from the output node to the APD can be prevented, and thus incorrect count can be prevented. Gate voltage Vg3 of third transistor 3 is typically set about 1 V lower than third voltage V3. In addition, although fourth transistor 4 in FIG. 6 is of the first conductivity type, fourth transistor 4 may be of the second conductivity type. The capacitance value of storage capacitance element C1 may be greater than the capacitance value of the parasitic capacitance of the output node. Moreover, since the capacitance value of storage capacitance element C1 is large, it is desirable that the resistance values of fourth transistor 4 and second transistor 2 are greater than that of the other transistors.

As has been described above, the photodetector according to Variation 2 of Embodiment 1 further includes fourth transistor 4 connected to a connection portion at which second transistor 2 and third transistor 3 are connected to each other and including a channel of the first conductivity type or the second conductivity type, and storage capacitance element C1 connected in series with fourth transistor 4.

With this, storage capacitance element C1 can be exposed to light a plurality of times, and can accumulate transmitted charge. Accordingly, accuracy and sensitivity of light detection can be improved.

Here, during a capacitance reset period, second transistor 2 and fourth transistor 4 may be concurrently brought into conduction to reset a voltage of one end of storage capacitance element C1 to third voltage V3. During an accumulation period, fourth transistor 4 may transmit, to storage capacitance element C1, the charge that has been transmitted to the one end of second transistor 2 during the exposure period. During the exposure period and the accumulation period, second transistor 2 may be in a half-ON state.

With this, excessive charge generated during an exposure period and an accumulation period can be discharged from second transistor 2 via third transistor 3. Accordingly, the reliability of the photodetector can be improved.

Here, second transistor 2 may also be in the half-ON state during a discharge period during which excessive charge accumulated in the one end of second transistor 2 is discharged after the transmission period.

With this, a voltage to be applied to the anode of an APD can be increased since second transistor 2 is in the half-ON state during a discharge period. Accordingly, the reliability of the photodetector can be improved.

Here, third transistor 3 may be in the half-ON state during at least one of the exposure period, the transmission period, or the discharge period.

According to the above, third transistor 3 in the half-ON state enables excessive charge to be transmitted from an APD to second transistor 2. Accordingly, the reliability of the photodetector can be improved.

Here, a threshold voltage of third transistor 3 may be higher than a threshold voltage of second transistor 2.

With this, third transistor 3 can be readily brought into the half-ON state as compared to bringing of second transistor 2 into the half-ON state.

[Variation 3 of Circuit]

Figure 9:
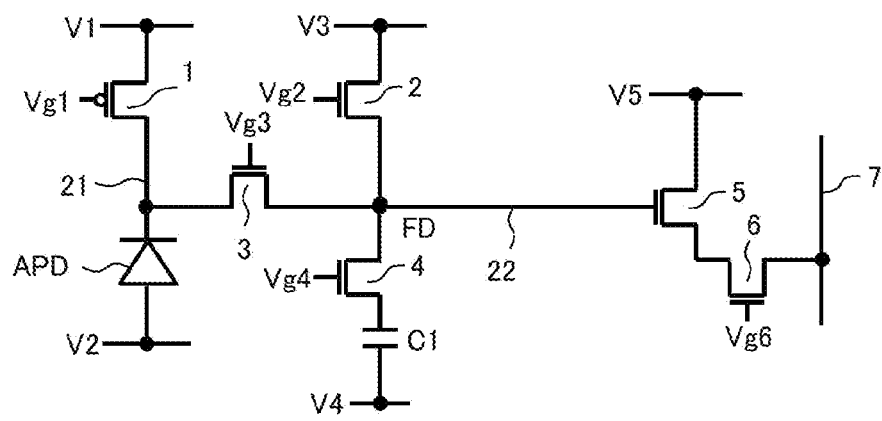
FIG. 9 is a circuit diagram illustrating an example of a configuration of the photodetector according to Variation 3 of Embodiment 1.

A different variation of the circuit according to Embodiment 1 will be described with reference to FIG. 9 and FIG. 10. FIG. 9 is a circuit diagram illustrating an example of a configuration of a photodetector according to Variation 3 of Embodiment 1. In addition to the circuit illustrated in FIG. 1, the photodetector illustrated in FIG. 9 includes fifth voltage V5, fifth transistor 5, sixth transistor 6, and signal line 7. Fifth transistor 5 serves as a part of a source follower circuit. A change in gate voltage Vg5 of fifth transistor 5 is output to a post-stage circuit via sixth transistor 6 and signal line 7. A photodetector that reads out an output using sixth transistor 6 is selected.

Figure 10:
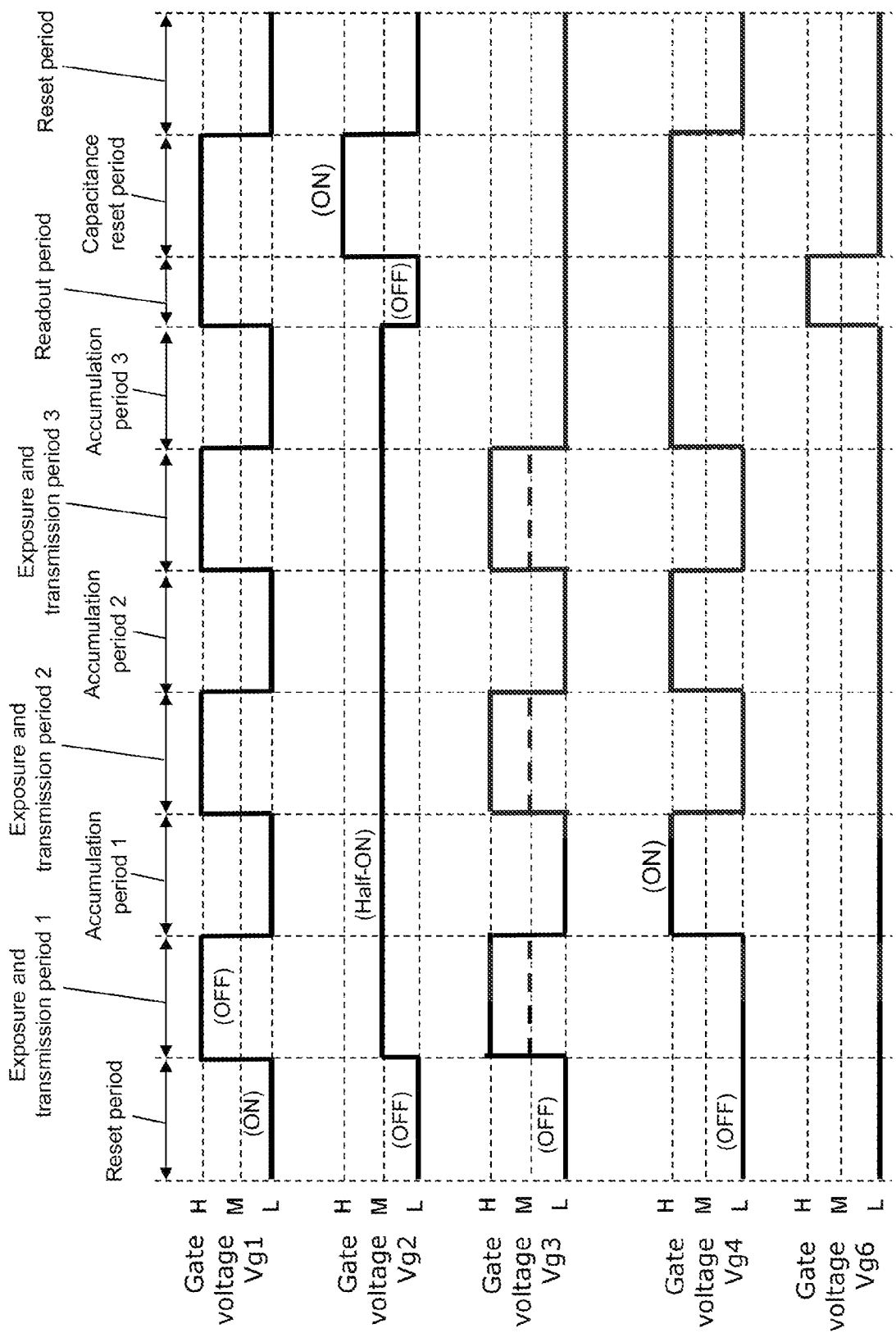
FIG. 10 is a timing diagram illustrating an example of a drive method for driving the photodetector according to Variation 3 of Embodiment 1.

FIG. 10 is a timing diagram illustrating an example of a drive method for driving the photodetector according to Variation 3 of Embodiment 1. In addition to the timing diagram shown in FIG. 7A, sixth transistor 6 is set at H during a readout period and set at L during the other periods in the timing diagram shown in FIG. 10. Since sixth transistor 6 is in a conduction state during the readout period, an output is output to the post-stage circuit via signal line 7. Note that fifth voltage V5, fifth transistor 5, sixth transistor 6, signal line 7 included in the circuit according to Variation 3 may be combined with any of the circuits according to the present embodiments.

[Configuration of Semiconductor Device as Circuit According to Variation 3]

Figure 11:
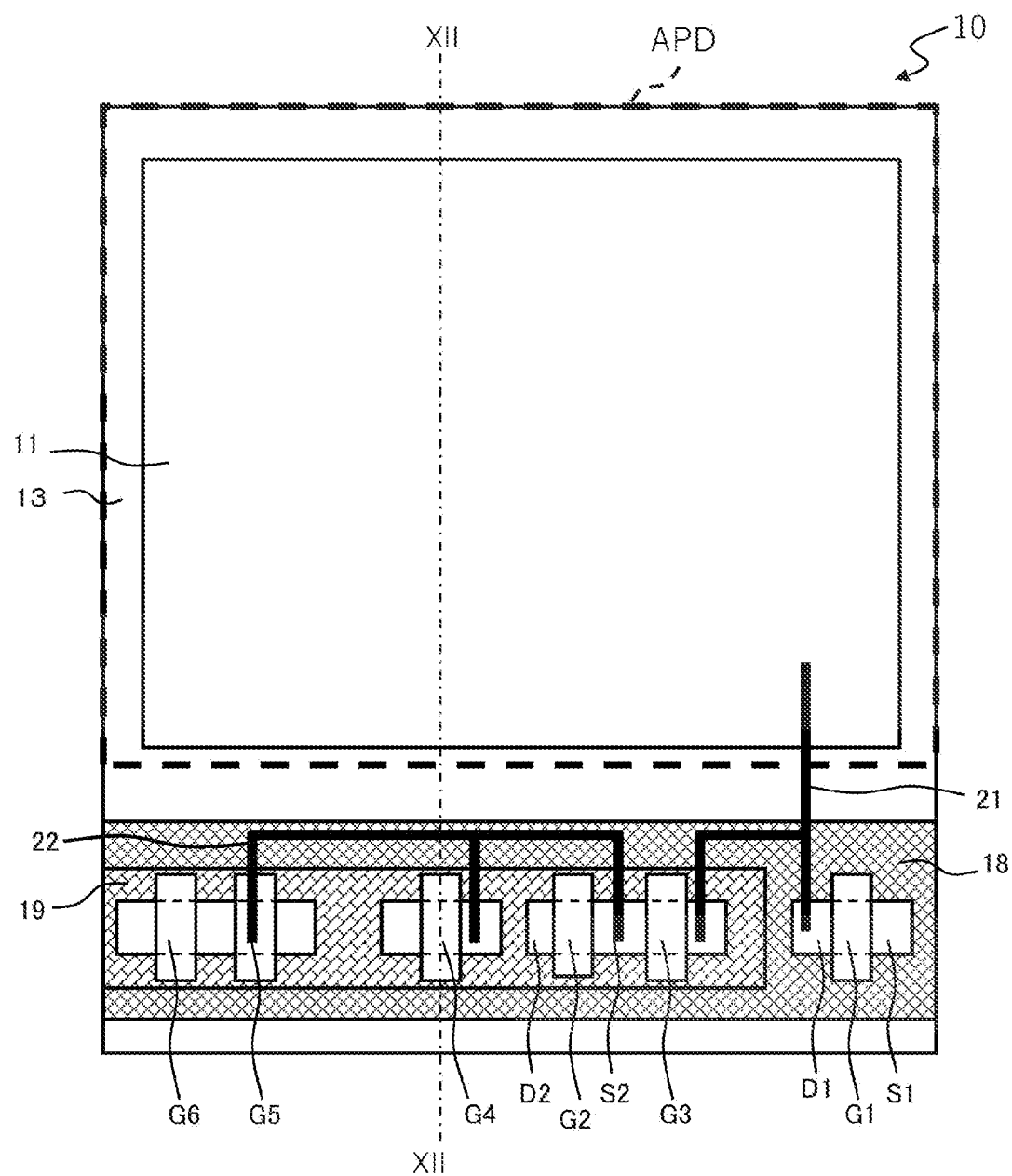
FIG. 11 is a plan view illustrating an example of a configuration of a semiconductor device as the photodetector according to Variation 3 of Embodiment 1.

FIG. 11 is a plan view illustrating an example of a configuration of a semiconductor device as the photodetector according to Variation 3 of Embodiment 1. The configuration illustrated in FIG. 11 includes semiconductor substrate 10, and the following disposed within semiconductor substrate 10: first semiconductor layer 11 of the first conductivity type, third semiconductor layer 13 of the second conductivity type, first well 18 of the first conductivity type, and second well 19 of the second conductivity type. First semiconductor layer 11 is the cathode of the APD. First transistor 1 is disposed within first well 18. Second transistor 2, third transistor 3, fourth transistor 4, fifth transistor 5, and sixth transistor 6 are disposed within second well 19. Note that the gate, source, drain of first transistor 1 are denoted by G1, S1, D1, respectively. The same applies to second transistor 2 through fifth transistor 5. FIG. 11 illustrates the following lines: (i) first line 21 that connects the cathode of the APD, drain D1 of first transistor 1, and the source of third transistor 3, and (ii) second line 22 that connects source S2 of second transistor 2, source S4 of fourth transistor 4, and gate G5 of fifth transistor 5. FIG. 11 omits illustrations of other lines. Second well 19 is disposed so as to be surrounded by first well 18.

Figure 12:
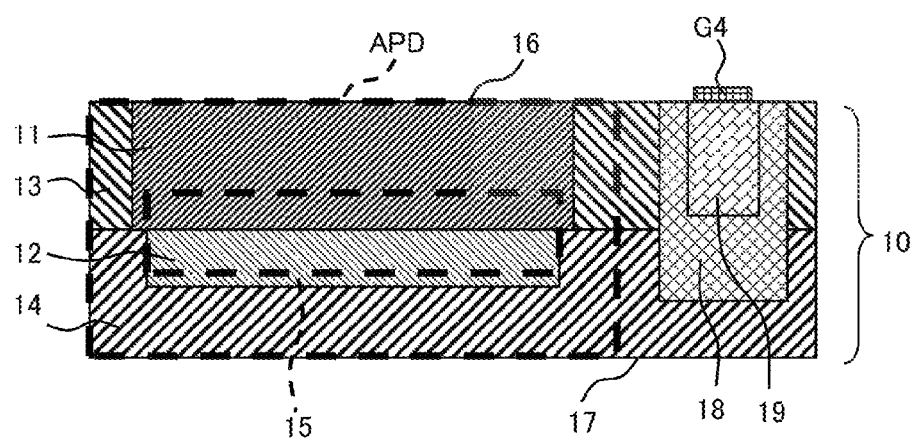
FIG. 12 is a cross sectional view of FIG. 11 taken along line XII-XII.

FIG. 12 is a cross sectional view of FIG. 11 taken along line XII-XII. Other than gate G4 of fourth transistor 4, illustrations of a line layer, a microlens, etc. are omitted. Incident light is incident on semiconductor substrate 10 from the first principal surface 16 side. In addition to the configuration illustrated in FIG. 11, the configuration illustrated in FIG. 12 includes second semiconductor layer 12 of the second conductivity type and fourth semiconductor layer 14 of the second conductivity type. First semiconductor layer 11 is disposed on the first principal surface 16 side of semiconductor substrate 10, and contacts first principal surface 16. The PN junction of first semiconductor layer 11 and second semiconductor layer 12 forms multiplication region 15. Multiplication region 15 is indicated by the inner dashed-line frame shown in FIG. 12. The APD is indicated by the outer dashed-line frame shown in FIG. 12. A voltage is applied to second semiconductor layer 12 from second principal surface 17 of semiconductor substrate 10 via fourth semiconductor layer 14. The concentration of an impurity in each of semiconductor layers, which are first semiconductor layer 11, second semiconductor layer 12, third semiconductor layer 13, fourth semiconductor layer 14, first well 18, and second well 19, may be changed according to positions within each of the semiconductor layers. Moreover, the concentration of an impurity in second semiconductor layer 12, third semiconductor layer 13, and fourth semiconductor layer 14 are not specified, and may be substantially the same. It is desirable that an electric field between first well 18 and fourth semiconductor layer 14 is sufficiently small. It is also desirable that, in the joining portion joining first well 18 and fourth semiconductor layer 14 together, (i) the concentration of an impurity in first well 18 is less than the concentration of an impurity in first semiconductor layer 11 or (ii) the concentration of an impurity in fourth semiconductor layer 14 is less than the concentration of an impurity in second semiconductor layer 12. In addition, second well 19 is disposed surrounded by first well 18 since second well 19 needs to be insulated from second semiconductor layer 12, third semiconductor layer 13, and fourth semiconductor layer 14. Third semiconductor layer 13 is interposed between first semiconductor layer 11 and first well 18 since first semiconductor layer 11 and first well 18 need to be insulated from each other. Particularly, in order to reduce the separation width between first semiconductor layer 11 and first well 18, at least part of a portion in which third semiconductor layer 13 and first principal surface 16 contact each other may be depleted. In this case, it is desirable that a contact and trench 23 are not provided on the first principal surface side 16 of third semiconductor layer 13.

As has been described above, the photodetector according Variation 3 of Embodiment 1 as a semiconductor device further includes: semiconductor substrate 10. Semiconductor substrate 10 includes first well 18 of the first conductivity type and second well 19 of the second conductivity type. First transistor 1 is disposed in first well 18, and second transistor 2 is disposed in second well 19.

Accordingly, the above-described photodetector is suitable for fining.

Here, at least one of first well 18 or second well 19 may be in a linear shape.

Accordingly, the above-described photodetector is suitable for fining. Moreover, since an APD can be disposed so as to be adjacent to a shorter-side direction of a well in a linear shape, the above-described photodetector is suitable for fining and for effective placement of the surface area of semiconductor substrate 10.

[Variation 1 of Semiconductor Device]

Figure 13:
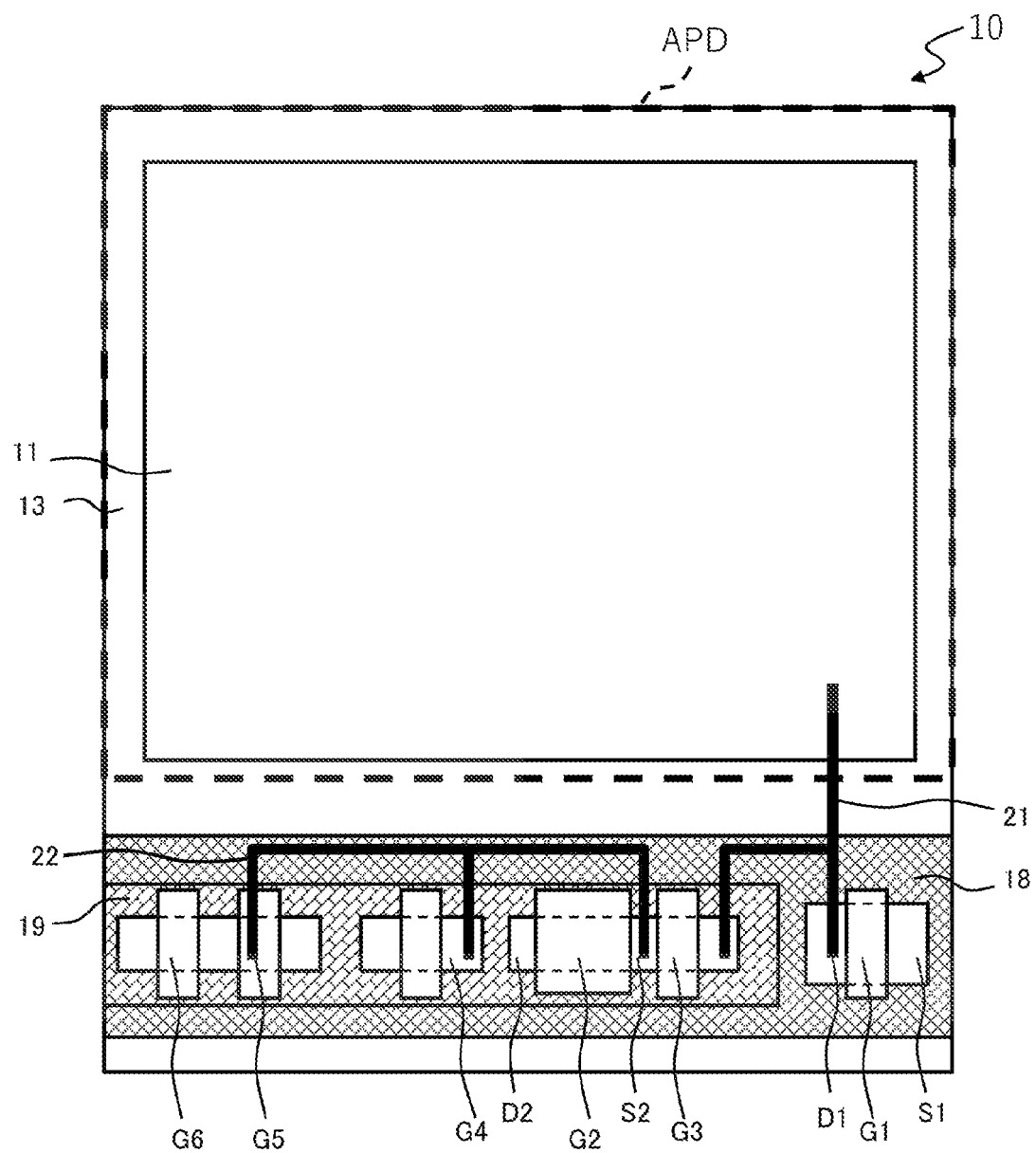
FIG. 13 is a plan view illustrating Variation 1 of the semiconductor device illustrated in FIG. 11.

FIG. 13 is a plan view illustrating an example of a configuration of a semiconductor device as the photodetector according to Variation 3 of Embodiment 1. In the plan view of the photodetector illustrated in FIG. 13, gate area sizes of first transistor 1 and second transistor 2 are larger than gate area sizes of the other transistors. The present disclosure also encompasses the case where the gate area size of first transistor 1 is larger than the gate area size of second transistor 2, and the case where the gate area size of second transistor 2 is larger than the gate area size of first transistor 1. When the photodetectors are arrayed, variations in resistance values of first transistors 1 and second transistors 2 to be included in an array need to be small. There is a trade-off between a small resistance value of first transistor 1 and a large resistance value of first transistor 1. Specifically, when the resistance value is small, quenching cannot be performed, and when the resistance value is large, a dead time is extended. In addition, when variations in resistance values of second transistors 2 are great, variations in amounts of charge to be accumulated in storage capacitance elements C1 according to Variation 2 of the circuit are great. Here, a resistance value of a transistor changes depending on a threshold voltage of the transistor. Moreover, the threshold voltage is dependent on a gate area size. The larger the gate area size, the smaller the variation in threshold voltages. For this reason, one of or both of first transistor 1 and second transistor 2 have gate area sizes larger than gate area sizes of the other transistors to reduce variations in threshold voltages of first transistor 1 and second transistor 2. Accordingly, the yield of a photodetector array can be improved.

In addition, it is desirable that first well 18 and second well 19 are linearly arranged in the longitudinal direction or the transverse direction. This can reduce area sizes of the well regions, and thus is advantageous in fining of the photodetector. In this case, the gate width of first transistor 1 may be increased since the width of first well 18 is greater than the width of second well 19. In FIG. 13, the gate width of first transistor 1 is greater than gate widths of the other transistors. Meanwhile, the gate length of second transistor 2 is greater than gate lengths of third transistor 3, fourth transistor 4, fifth transistor 5, and sixth transistor 6.

As has been described above, in the photodetector according to Variation 1 of the semiconductor device of Embodiment 1, at least one of a gate area size of first transistor 1 or a gate area size of second transistor 2 may be larger than a gate area size of another transistor within the photodetector.

With this, dielectric breakdowns of gate oxide films of first transistor 1 and second transistor 2 are less likely to occur, and thus the reliability of the photodetector can be improved.

Here, at least one of a gate oxide film of first transistor 1 or a gate oxide film of second transistor 2 may be thicker than a gate oxide film of another transistor within the photodetector.

With this, dielectric breakdowns of gate oxide films of first transistor 1 and second transistor 2 are less likely to occur, and thus the reliability of the photodetector can be improved.

[Variation 2 of Semiconductor Device]

Figure 14:
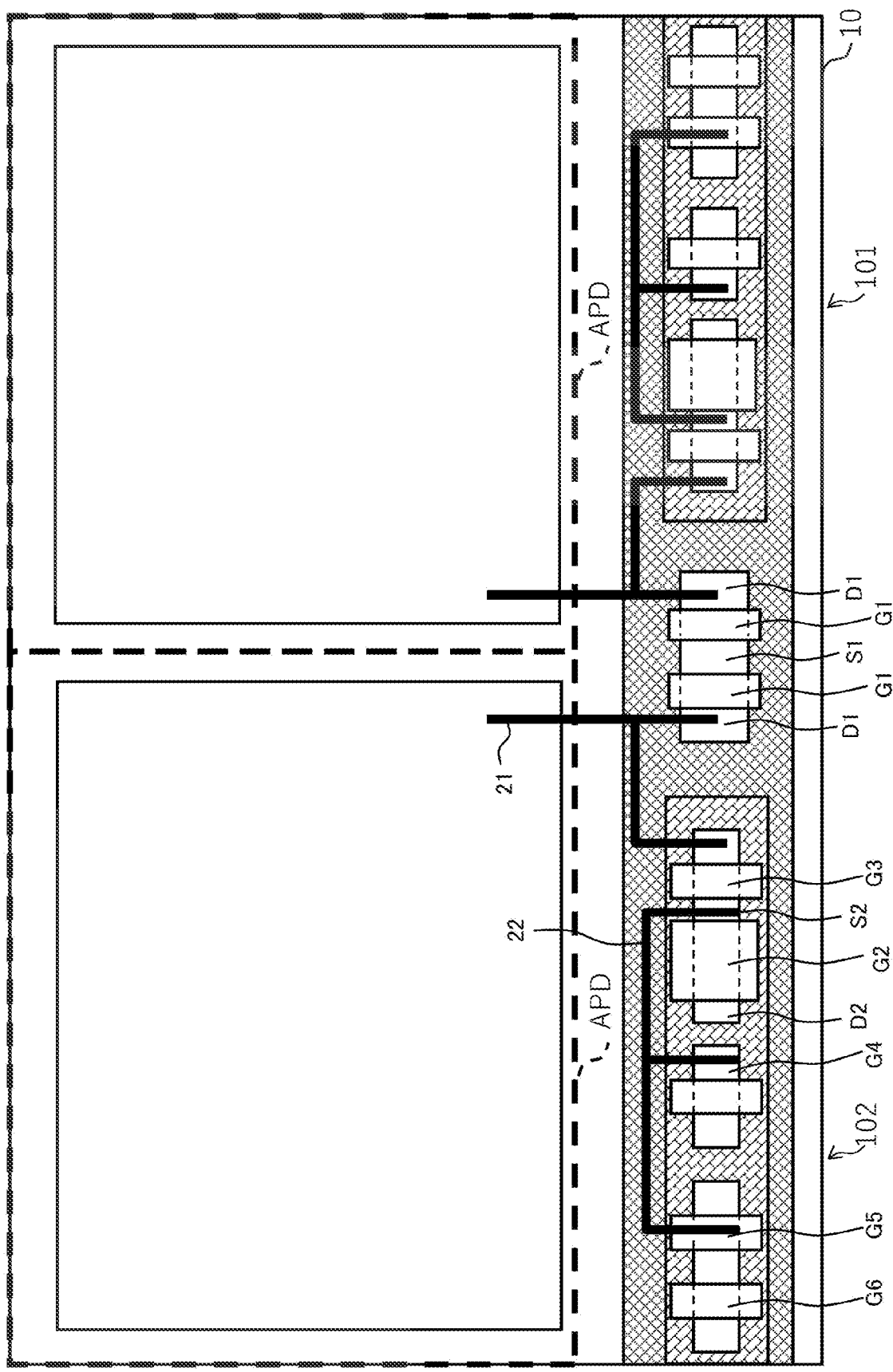
FIG. 14 is a plan view illustrating Variation 2 of the semiconductor device illustrated in FIG. 11.
Figure 15:
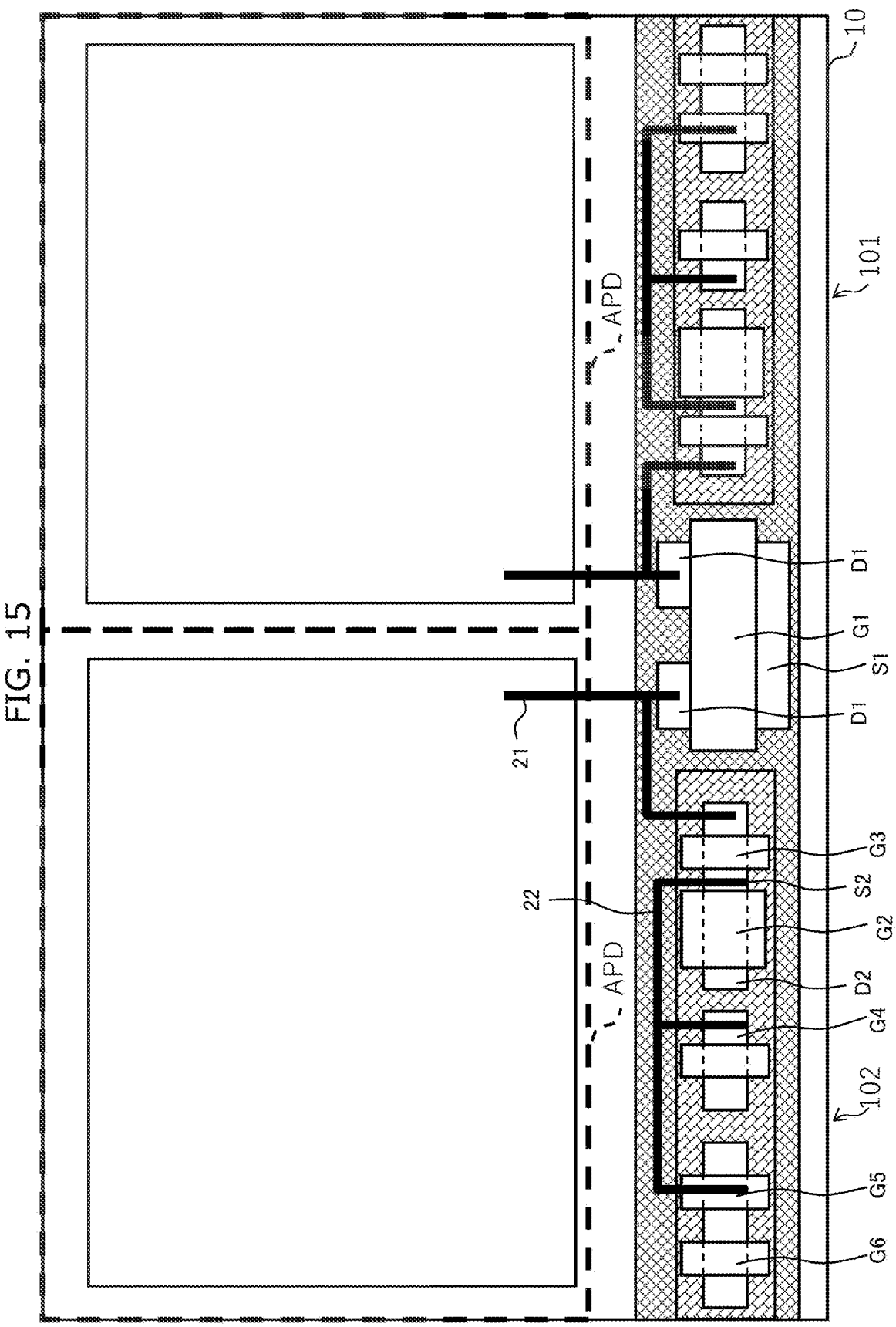
FIG. 15 is a plan view illustrating another example of Variation 2 of the semiconductor device illustrated in FIG. 11.

FIG. 14 is a plan view illustrating Variation 2 of the semiconductor device illustrated in FIG. 11. The plan view of photodetectors according to FIG. 14 shows a plan view of first photodetector circuit 101 and second photodetector circuit 102 as two adjacent photodetector circuits. In the plan view according to FIG. 14, the two adjacent photodetector circuits, which are first photodetector circuit 101 and second photodetector circuit 102, share a well of first transistors 1. Furthermore, the two first transistors 1 share the source. This can reduce regions of the transistors and the well, and thus is advantageous in fining of photodetectors. FIG. 15 is a plan view illustrating another example of Variation 2 of the semiconductor device illustrated in FIG. 11. As illustrated in FIG. 15, the layout of the semiconductor device may include transistors that share a gate. This can reduce regions of the transistors and the well, and thus is advantageous in fining of photodetectors. Moreover, the layout of the two photodetector circuits, which are first photodetector circuit 101 and second photodetector circuit 102, arranged in mirror symmetry with respect to the boundary between first photodetector circuit 101 and second photodetector circuit 102 as illustrated in FIG. 14 can reduce variations in characteristics of transistors.

As has been described above, the photodetector according to Variation 2 of the semiconductor device of Embodiment 1, further includes: first photodetector circuit 101 including an APD, first transistor 1, and second transistor 2; and second photodetector circuit 102 including the same elements as first photodetector circuit 101. At least one of first well 18 or second well 19 is commonly used by the first photodetector circuit and the second photodetector circuit.

Accordingly, the above-described photodetector is suitable for fining.

Here, any of a gate, a drain, and a source of first transistor 1 may be shared by first photodetector circuit 101 and second photodetector circuit 102.

Here, a direction of the channel of first transistor 1 may be orthogonal to a direction of a channel of a transistor of the second conductivity type.

Here, first photodetector circuit 101 and second photodetector circuit 102 may be arranged in mirror symmetry in a plan view of semiconductor substrate 10.

[Variation 3 of Semiconductor Device]

Figure 16:
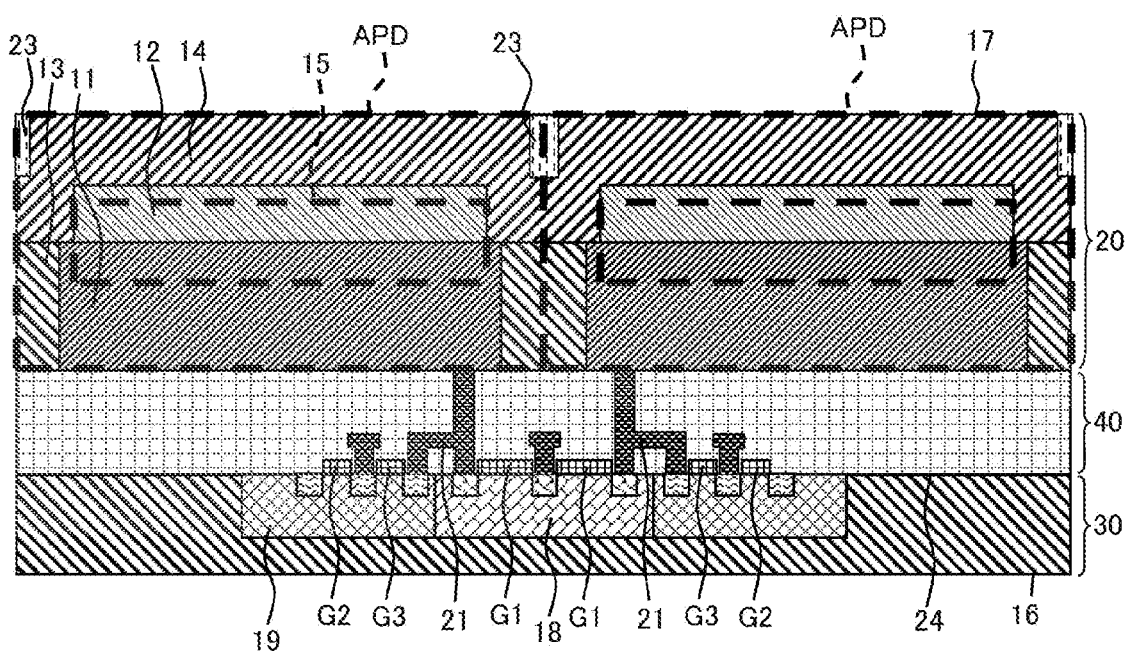
FIG. 16 is a cross sectional view illustrating Variation 3 of the semiconductor device illustrated in FIG. 11.

FIG. 16 is a cross sectional view illustrating Variation 3 of the semiconductor device according to Embodiment 1.

The semiconductor device illustrated in FIG. 16 includes first semiconductor substrate 20, second semiconductor substrate 30, and line layer 40. APDs are disposed in first semiconductor substrate 20, and transistors are disposed on the third principal surface side of second semiconductor substrate 30. Note that although FIG. 16 illustrates first transistor 1, second transistor 2, and third transistor 3, their positions are not limited to the positions illustrated in FIG. 16. The following are joined together via each of first lines 21 inside line layer 40: (i) the cathode of an APD which is disposed in the first principal surface of first semiconductor substrate 20, (ii) the drain of first transistor 1 which is disposed in the third principal surface of second semiconductor substrate 30, and (iii) the source of third transistor 3. Incident light is incident on the semiconductor device from the second principal surface side of first semiconductor substrate 20. This excludes a well region from first semiconductor substrate 20, and thus is advantageous in fining of the semiconductor device. In this case, two or more adjacent photodetector circuits can also commonly use any of a well, the drain, and the source of first transistors 1. Moreover, as illustrated in FIG. 16, trenches 23 may be provided in the boundary region between adjacent APDs in first semiconductor substrate 20 to reduce a color mixture. In this case, it is desirable to protect the surfaces of trenches 23 to avoid depletion of the surfaces of trenches 23, and multiplication regions 15 and trenches 23 need not contact one another. For this reason, it is desirable that trenches 23 are to be disposed closer to the second principal side than to multiplication regions 15. Specifically, trenches 23 may be formed closer to the second principal side than to the boundary between first semiconductor layer 11 and second semiconductor layer 12.

As has been described above, the photodetector according to variation 3 of the semiconductor device of Embodiment 1 further includes first semiconductor substrate 20 in which an APD is disposed, and second semiconductor substrate 30 in which the first transistor and the second transistor are disposed.

Here, first semiconductor substrate 20 may further include trench 23. Trench 23 may be disposed on a light illumination surface side of first semiconductor substrate 20 with respect to a multiplication region of the APD.

Moreover, a photodetector array according to Embodiment 1 includes two or more of the above-described photodetectors.

Here, the photodetector array may further include an isolation region between APDs adjacent to each other or between the APD and first transistor 1. At least part of the isolation region may be a depletion layer.

Here, the isolation region need not include any of trench 23 and a contact.

Hereinbefore, the photodetector, the photodetector array, and the drive method thereof according to one or more aspects have been described based on the embodiments; however, the present disclosure is not limited to these embodiments. The scope of the one or more aspects of the present disclosure may encompass embodiments as a result of making, to the embodiments, various modifications that may be conceived by those skilled in the art and combining structural elements in different embodiments, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to photodetectors, photodetector arrays, and drive methods thereof. For example, the present disclosure is applicable to solid-state image capturing devices, distance measuring devices, cameras, etc.

The invention claimed is:

1. A photodetector comprising:
at least one avalanche photodiode (APD) including a first semiconductor layer of a first conductivity type and a second semiconductor layer of a second conductivity type;
a first transistor connected to the first semiconductor layer and including a channel of the second conductivity type that has polarity opposite to polarity of the first conductivity type; and
a second transistor connected to the first semiconductor layer and including a channel of the first conductivity type.

2. The photodetector according to claim 1, wherein the first transistor is brought into:
conduction during a reset period during which a voltage of the first semiconductor layer is reset to a first voltage; and
non-conduction during an exposure period during which the at least one APD detects light.

3. The photodetector according to claim 2, wherein the second transistor is brought into:
non-conduction during the reset period; and
a half-ON state during the exposure period.

4. The photodetector according to claim 3, wherein during the exposure period, a difference between a gate voltage of the second transistor and a second voltage is less than a breakdown voltage of the at least one APD, the second voltage being a voltage of the second semiconductor layer included in the at least one APD.

5. The photodetector according to claim 1, wherein the first transistor includes a first terminal connected to the first semiconductor layer and a second terminal connected to a power line,
the second transistor includes a third terminal connected to the first semiconductor layer and a fourth terminal connected to the power line, and
the second terminal and the fourth terminal are electrically connected.

6. The photodetector according to claim 2, further comprising:
a third transistor including a channel of the first conductivity type, wherein
the second transistor is connected to the first semiconductor layer via the third transistor.

7. The photodetector according to claim 6, wherein during a transmission period, the third transistor transmits charge accumulated in the at least one APD to one end of the second transistor, and
the exposure period and the transmission period are a same period.

8. The photodetector according to claim 7, further comprising:
a fourth transistor connected to a connection portion at which the second transistor and the third transistor are connected to each other and including a channel of the first conductivity type or the second conductivity type; and
a storage capacitance element connected in series with the fourth transistor.

9. The photodetector according to claim 8, wherein during a capacitance reset period, the second transistor and the fourth transistor are concurrently brought into conduction to reset a voltage of one end of the storage capacitance element to a third voltage V3,
during an accumulation period, the fourth transistor transmits, to the storage capacitance element, the charge that has been transmitted to the one end of the second transistor during the exposure period, and
during the exposure period and the accumulation period, the second transistor is in a half-ON state.

10. The photodetector according to claim 9, wherein the second transistor is also in the half-ON state during a discharge period during which excessive charge accumulated in the one end of the second transistor is discharged after the transmission period.

11. The photodetector according to claim 10, wherein the third transistor is in the half-ON state during at least one of the exposure period, the transmission period, or the discharge period.

12. The photodetector according to claim 9, wherein a threshold voltage of the third transistor is higher than a threshold voltage of the second transistor.

13. The photodetector according to claim 1, wherein
at least one of a gate area size of the first transistor or a gate area size of the second transistor is larger than a gate area size of an other transistor within the photodetector.

14. The photodetector according to claim 1, wherein
at least one of a gate oxide film of the first transistor or a gate oxide film of the second transistor is thicker than a gate oxide film of an other transistor within the photodetector.

15. The photodetector according to claim 1, further comprising:
a semiconductor substrate, wherein
the semiconductor substrate includes a first well of the first conductivity type and a second well of the second conductivity type,
the first transistor is disposed in the first well, and
the second transistor is disposed in the second well.

16. The photodetector according to claim 15, wherein
at least one of the first well or the second well is in a linear shape.

17. The photodetector according to claim 15, further comprising:
a first photodetector circuit including the at least one APD, the first transistor, and the second transistor; and
a second photodetector circuit including same elements as the first photodetector circuit, wherein
at least one of the first well or the second well is commonly used by the first photodetector circuit and the second photodetector circuit.

18. The photodetector according to claim 17, wherein
any of a gate, a drain, and a source of the first transistor is shared by the first photodetector circuit and the second photodetector circuit.

19. The photodetector according to claim 15, wherein
a direction of the channel of the first transistor is orthogonal to a direction of a channel of a transistor of the second conductivity type.

20. The photodetector according to claim 17, wherein
the first photodetector circuit and the second photodetector circuit are arranged in mirror symmetry in a plan view of the semiconductor substrate.

21. The photodetector according to claim 1, further comprising:
a first semiconductor substrate in which the at least one APD is disposed; and
a second semiconductor substrate in which the first transistor and the second transistor are disposed.

22. The photodetector according to claim 21, wherein
the first semiconductor substrate further includes a trench, and
the trench is disposed on a light illumination surface side of the first semiconductor substrate with respect to a multiplication region of the at least one APD.

23. The photodetector according to claim 1, wherein
the at least one APD is used in a Geiger multiplication mode.

24. A photodetector array comprising:
two or more photodetectors, the two or more photodetectors each being the photodetector according to claim 1.

25. The photodetector array according to claim 24, further comprising:
an isolation region between APDs adjacent to each other or between the at least one APD and the first transistor, the APDs each being the at least one APD, wherein
at least part of the isolation region is a depletion layer.

26. The photodetector array according to claim 25, wherein
the isolation region includes neither a trench nor a contact.

27. A drive method for driving a photodetector, wherein
the photodetector includes:
at least one avalanche photodiode including a first semiconductor layer of a first conductivity type and a second semiconductor layer of a second conductivity type;
a first transistor connected to the first semiconductor layer and including a channel of the second conductivity type that has polarity opposite to polarity of the first conductivity type; and
a second transistor connected to the first semiconductor layer and including a channel of the first conductivity type, and
the drive method comprises:
during a reset period, bringing (i) the first transistor into conduction to reset a voltage of the first semiconductor layer to a first voltage and (ii) the second transistor into non-conduction; and
during an exposure period after the reset period, bringing (i) the first transistor into non-conduction and (ii) the second transistor into a half-ON state.

* * * * *